United States Patent [19]

Vince

[11] Patent Number: 5,068,631
[45] Date of Patent: Nov. 26, 1991

[54] SUB POWER PLANE TO PROVIDE EMC FILTERING FOR VLSI DEVICES

[75] Inventor: Richard A. Vince, Newburyport, Mass.

[73] Assignee: AT&T Bell Laboratories, Murray Hill, N.J.

[21] Appl. No.: 564,998

[22] Filed: Aug. 9, 1990

[51] Int. Cl.$^5$ .................. H03H 7/00; H05K 1/18
[52] U.S. Cl. ................... 333/181; 333/12; 361/401; 174/250
[58] Field of Search .............. 333/12, 185, 181, 246, 333/247; 361/395, 397, 400, 401, 403, 409, 412, 1, 413, 424; 174/250, 255, 260, 261

[56] References Cited

U.S. PATENT DOCUMENTS

| | | | |
|---|---|---|---|
| 4,705,917 | 11/1987 | Gates, Jr. et al. | 361/414 X |
| 4,754,101 | 6/1988 | Stickney et al. | 174/35 |
| 4,779,164 | 10/1988 | Menzies, Jr. et al. | 361/393 |
| 4,821,005 | 4/1989 | Kling | 333/185 X |
| 4,882,656 | 11/1989 | Menzies, Jr. et al. | 361/393 |
| 4,954,929 | 9/1990 | Baran | 361/414 X |

OTHER PUBLICATIONS

Silent Serpent ™ SS-PGA, Concept Manufacturing Incorporated 1990.
Silent Serpent ™ SS-DIP, Concept Manufacturing Incorporated 1990.
Silent Serpent ™ D-Cap Socket CS Series, Concept Manufacturing Incorporated.
*Interference Control in Computers and Microprocessor-Based Equipment*, Michel Mardiguian, First Edition, 1984, Don White Consultants, Inc., pp. 2.23–2.25, 4.1–4.4, 6.17–6.19.
*EMI Control in the Design of PRINTED CIRCUIT BOARDS AND BACKPLANES*, Donald R. J. White, MSEE/PE, 3rd Edition, copyright 1982, Don White Consultants, Inc., pp. 2.11–2.17, 1982.

Primary Examiner—Eugene R. LaRoche
Assistant Examiner—Seung Ham
Attorney, Agent, or Firm—Thomas Stafford

[57] ABSTRACT

Electromagnetic filtering for a VLSI device having multiple power input leads is realized by employing a sub-power plane which is physically separate from a main power distribution system on a circuit board. The sub-power plane is placed directly under a corresponding VLSI device. Decoupling capacitors are connected to the sub-power plane and, in turn, to each of the power input leads on the VLSI device. Power is supplied from the main power distribution system to the sub-power plane via a ferrite bead type filter.

11 Claims, 5 Drawing Sheets

SUB POWER PLANE TO PROVIDE EMC FILTERING FOR VLSI DEVICES

TECHNICAL FIELD

This invention relates to electromagnetic compatibility (EMC) and, more particularly, to power filtering for VLSI devices on a circuit board.

BACKGROUND OF THE INVENTION

A problem with new VLSI devices having multiple power input leads is to provide a low impedance/low noise source of power to all of the power input leads. In the past, such VLSI devices were coupled directly to a main power plane or some other power distribution network, e.g., a grid. This power plane or grid typically covered the entire corresponding circuit board. Such arrangements could have "high" impedance or noise and, consequently, would cause so-called "glitches" on the output from the VLSI device. In turn, the VLSI device could induce noise on the power plane or power distribution network which caused problems with other devices on the circuit board. Additionally, so-called "common mode noise" would be emitted from the circuit board, which is highly undesirable. One attempt to eliminate the problems with the prior power distribution arrangements on circuit boards was to filter the power coming to the VLSI device and, then, employ a single power lead which was connected to all the power input leads on the VLSI device. A serious problem with this arrangement is that the single power lead is essentially an inductor at "high" frequencies which causes a significant amount of noise to be introduced into the VLSI device and also to be emitted from the board. Again, this is a highly undesirable condition.

SUMMARY OF THE INVENTION

The problems with prior power distribution systems for VLSI devices having multiple power inputs are overcome, in accordance with the invention, by employing a so-called "sub-power plane" in prescribed spatial relationship and physically separated from a main power distribution system on a circuit board. The sub-power plane is advantageously positioned on a circuit board to be directly under at least one corresponding VLSI device. Power is supplied from the sub-power plane to each power input lead on the at least one VLSI device. Additionally, a decoupling capacitor is connected between each power input lead connection of the sub-power plane and a ground potential, e.g., a ground grid. The decoupling capacitors advantageously supply transient switching current to the at least one VLSI device. Power from the main power distribution system is supplied to the sub-power plane via a filter. In a specific embodiment of the invention, the filter comprises a ferrite bead, i.e., an inductor, and appropriate decoupling capacitors.

DETAILED DESCRIPTION

Figure 1:
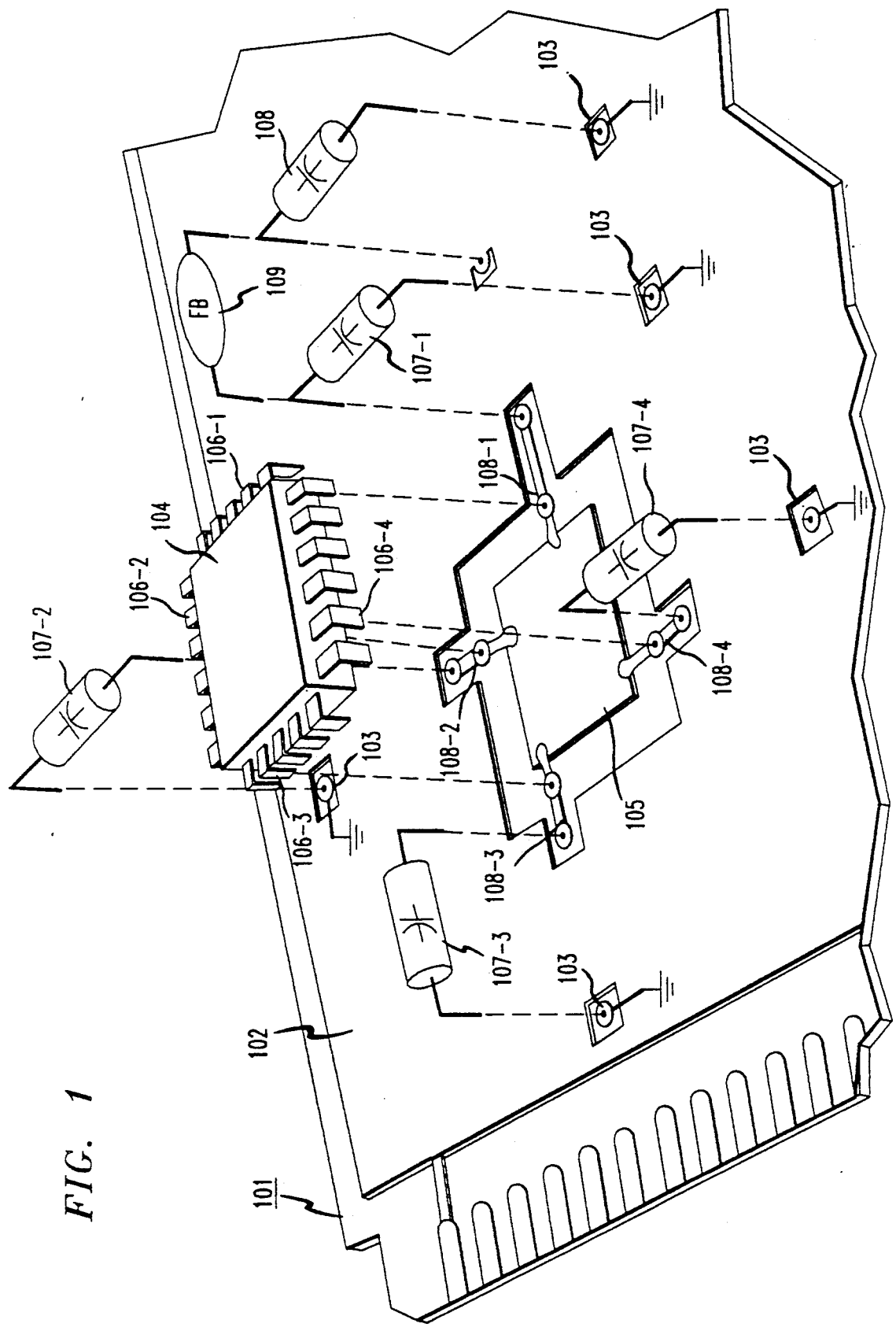
FIG. 1 is a perspective of a portion of a circuit board illustrating an embodiment of the invention.

FIG. 1 shows a portion of a circuit board, including an embodiment of the invention. Accordingly, shown are circuit board 101 including main power distribution system 102, ground system 103, VLSI device 104 and sub-power plane 105. In this example, a solid main power plane is employed for power distribution system 102. It will be apparent to those skilled in the art that other power distribution systems, e.g., a power grid or the like, may equally be employed. Similarly, the ground system may be a grid, plane or the like. In this example, a ground grid is employed. VLSI device 104, which in this example has a plurality of power input leads 106-1 through 106-4, is intended to be placed directly over sub-power plane 105. Power leads 106-1 through 106-4 are intended to be connected in circuit with sub-power plane 105 via connectors 108-1 through 108-4, respectively. Additionally, decoupling capacitors 107-1, 107-2, 107-3 and 107-4, are connected to sub-power plane 105 via connectors 108-1 through 108-4 and, hence, to power input leads 106-1 through 106-4, respectively. Capacitors 107 supply transient switching current to VLSI device 104, from sub-power plane 105. Although the illustration in FIG. 1 shows the capacitors as axial lead type, which are to be through mounted, in a preferred embodiment, surface mounted capacitors are employed. Since, VLSI device 104 for which the sub-power plane of this invention is to be employed are used for "high" frequency applications, for example; 25 MHz or above, the decoupling capacitors should be of a type used for such high frequency applications. A preferred type of capacitor is a ceramic type. The power from the main power plane 102 is supplied to sub-power plane 105 via a filter comprising capacitor 108, inductor 109 and decoupling capacitor 107-1, which is a familiar $\pi$ type filter. Inductor 109, preferably is a so-called "ferrite bead" inductor of a type well known in the art. Although sub-power plane 105 is shown as being completely surrounded by main power plane 104, it will be apparent that it can be placed anywhere in relationship to the main power plane 102, even at the edge or a corner of circuit board 101.

It is further noted that as shown in FIG. 1, sub-power plane 105 is in the same spatial planar relationship as main power plane 102 relative to the surface of circuit board 101. That is, sub-power plane 105 is in the same plane as the main power plane 102.

As illustrated in FIG. 1, the sub-power plane 105 is physically separated, i.e., decoupled from the main power plane, and situated directly below and essentially contiguous with VLSI device 104. It is noted that sub-power plane 105 is a low impedance and, hence, low inductance source of power for all of the power leads 106 of VLSI device 104. The unique configuration of power plane 105 and capacitors 107-1 through 107-4 in this example, essentially form a distributed filter arrangement for the "high" frequency VLSI device. This unique configuration of sub-power plane 105 and capacitors 107 also provides the switching current at the extremely high speeds, for example, 1 nanosecond, required by high speed VLSI device 104 intended to be mounted on circuit board 101. Additionally, sub-power plane 105 in conjunction with capacitors 107, provides a localized radio frequency counterpoise, i.e., ground plane, for the radio frequency fields radiated from the VLSI device 104, when operating at the high frequencies. Again, it is noted that these type VLSI devices are intended to operate in a range of 25 MHz or above. Thus, it is seen by using a $\pi$ filter comprising capacitors 107-1 and 108 and ferrite bead 109 to couple power to sub-power plane 105 and decoupling capacitors 107 associated with each of the power leads 106 on the VLSI device 104, a unique power distribution and radiation suppression system is formed. A technical advantage of this unique power distribution system is that it minimizes electromagnetic radiation from the circuit board.

Figure 2:
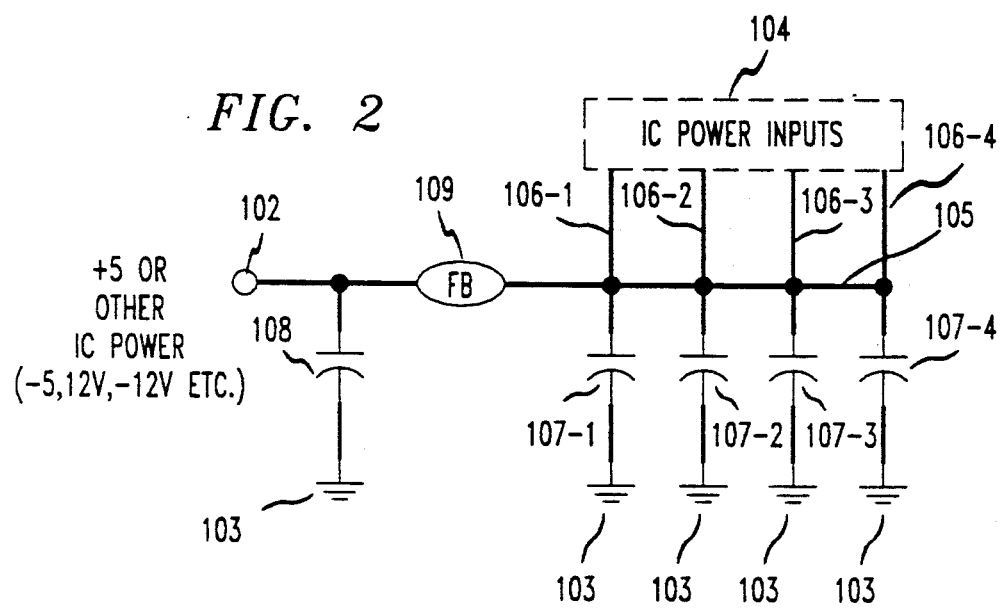
FIG. 2 is a schematic representation of the invention.

FIG. 2 illustrates in schematic diagram form the power distribution system illustrated in FIG. 1. Accordingly, the power from the main power plane 102 is decoupling capacitor 108 via ferrite bead 109 to decoupling capacitor 107-1 and to sub-power plane 105. Connected to power plane 105 are additional decoupling capacitors 107-2 through 107-4 and power input leads 106-1 through 106-4 of VLSI device 104. Additionally, capacitor 108, ferrite bead 109 and capacitor 107-1 form the well known $\pi$ filter arrangement, as discussed above. The power supplied via main power plane 102 can be any desired voltage.

Figure 3:
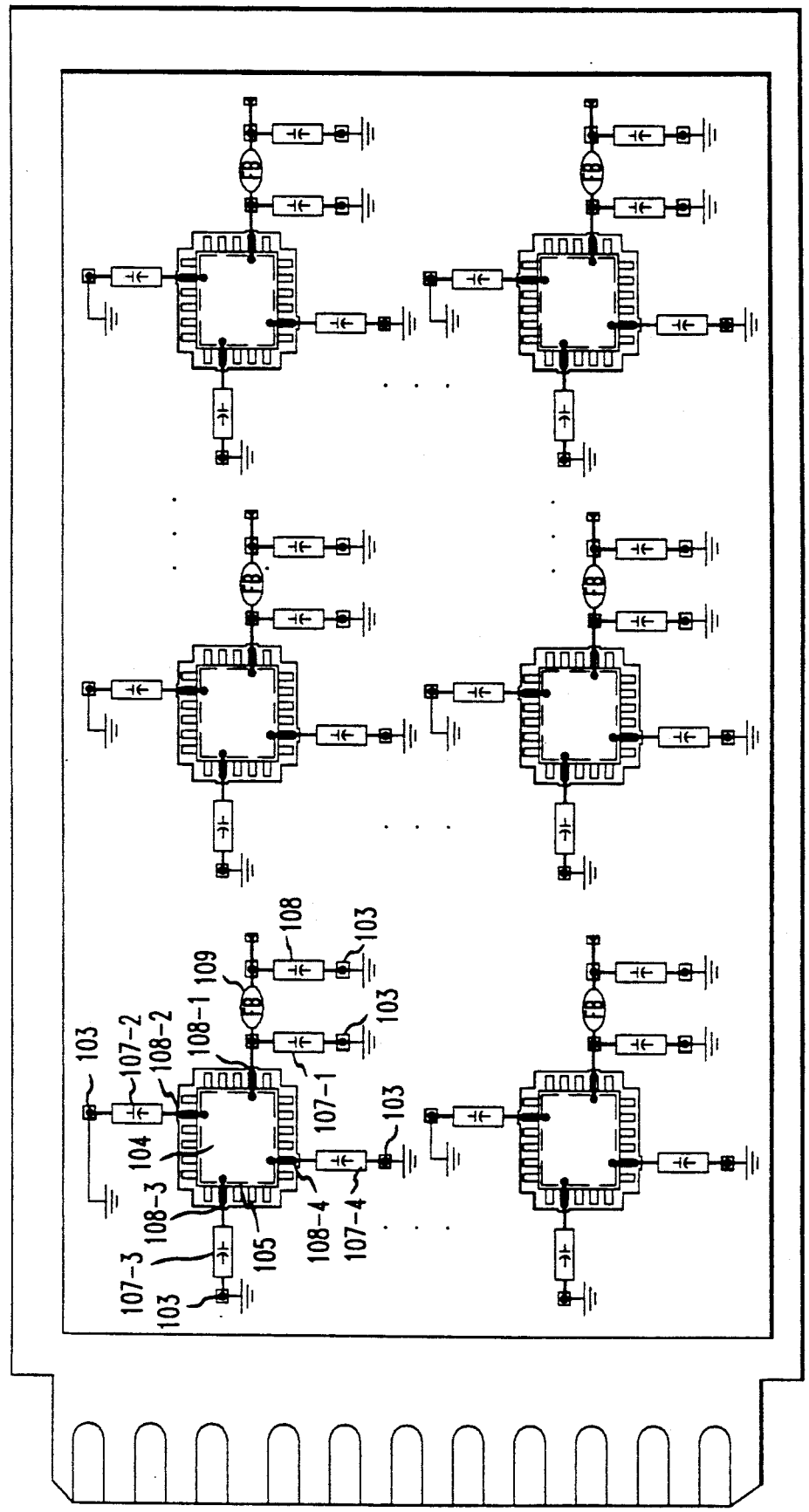
FIG. 3 shows a circuit board including a plurality of VLSI devices and incorporating the invention.

FIG. 3 shows circuit board 301 including a main power plane 102 and a plurality of VLSI devices each of which is mounted directly over a corresponding sub-power plane of this invention. Although the elements of each of the VLSI devices and its corresponding sub-power plane are arranged in similar fashion, only one VLSI device and sub-power plane have been numbered to correspond to the implementation of the invention as shown in FIG. 1.

Figure 4:
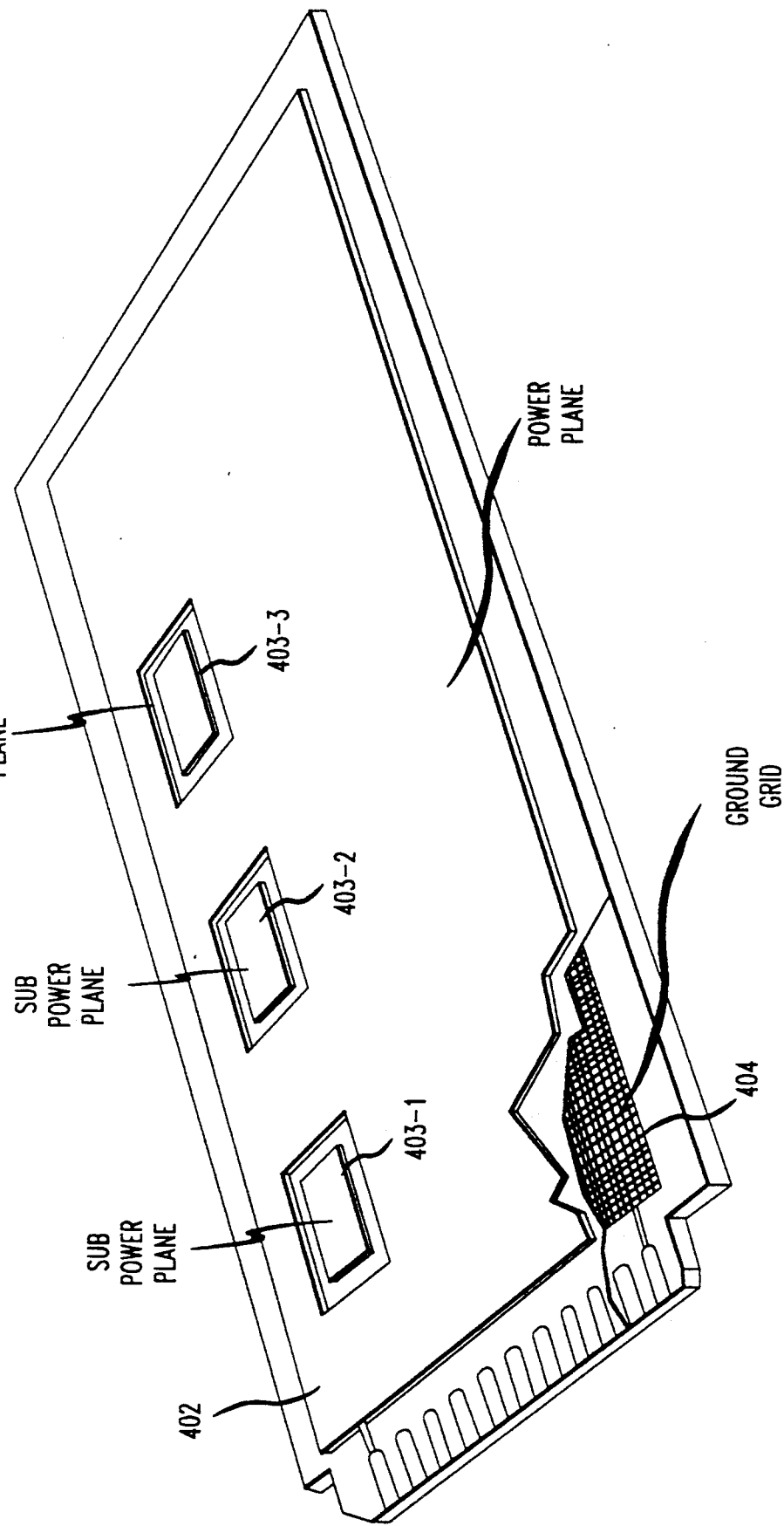
FIG. 4 is another perspective showing the relationship of a plurality of sub-power planes to the main power plane and ground grid of a circuit board.

FIG. 4 illustrates a preferred embodiment of the invention. Accordingly, shown are circuit board 401, a main power plane 402, a plurality of sub-power planes 403-1, 403-2 and 403-3. As noted above, sub-power planes 403 are in prescribed spatial relationships to the main power plane 402 and physically decoupled from it, as illustrated. FIG. 4 also shows that the prescribed spatial relationship of sub-power planes 403 is that they are in the same spatial planar relationship as main power plane 402 relative to the surface of circuit board 401. That is, sub-power planes 403 are in the same plane as main power-plane 402. Also, shown is ground grid 404, which is physically under and insulated from power plane 402 and sub-power planes 403, in known fashion.

Figure 5:
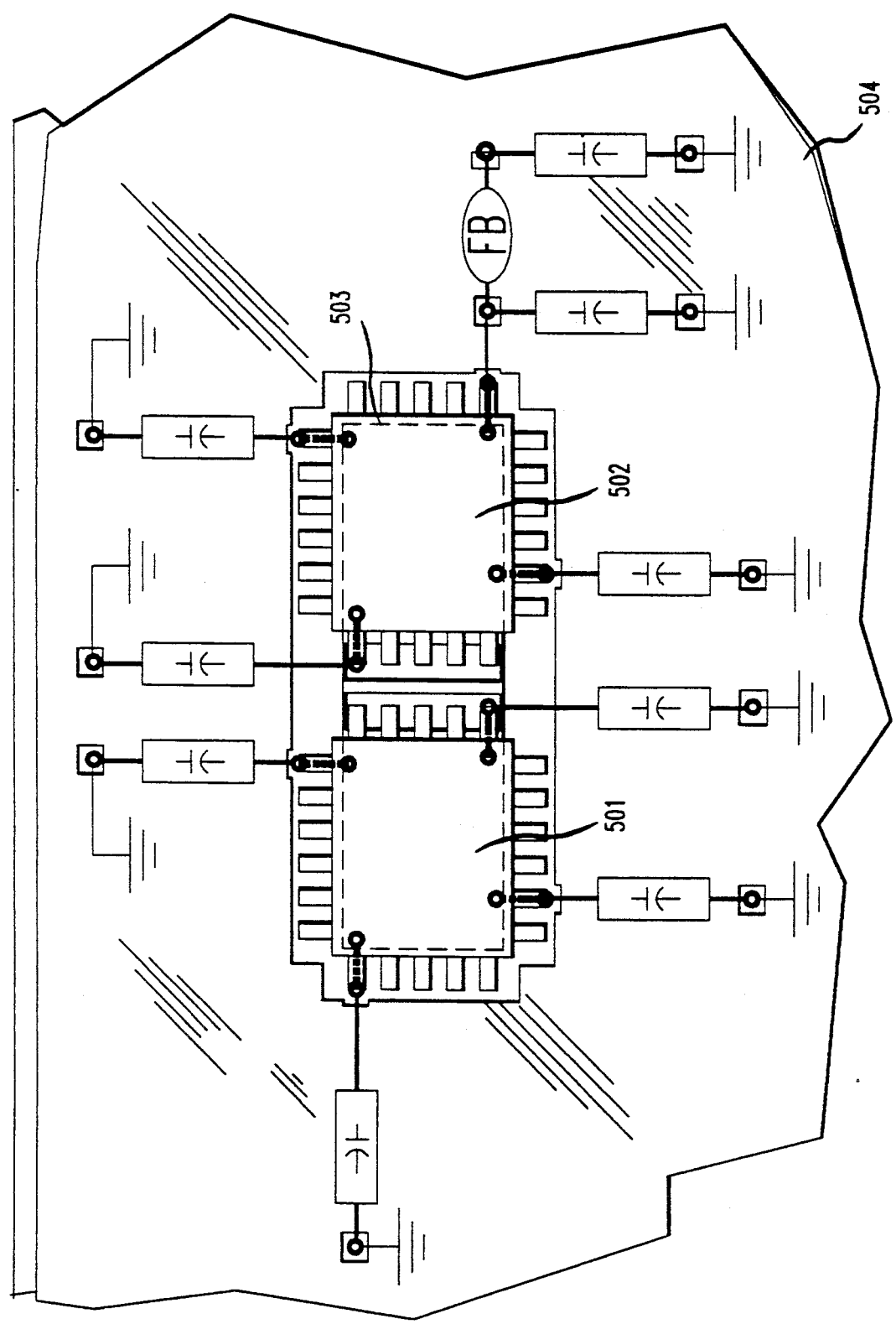
FIG. 5 shows a portion of a circuit board including another embodiment of the invention.

FIG. 5 illustrates a portion of circuit board 501 and including another embodiment of the invention. Accordingly, shown are VLSI devices 501 and 502, which are connected to circuit board 500 over sub-power plane 503, shown in dashed outline. In this embodiment of the invention, a plurality of VLSI devices which are co-related in operation, can share the same sub-power plane 503. Such VLSI devices, for example, may comprise a microprocessor, i.e., device 501, and its associated clock or line driver circuitry, i.e., VLSI device 502. The decoupling and supplying of the power from the main power plane 504 are as described above in relationship to FIG. 1. The reason that a plurality of VLSI devices can be placed on a single sub-power plane is that devices with similar noise potential can be filtered using the same filter and sub-power plane arrangement. Such VLSI devices usually operate in conjunction with each other as a single entity-passing data among the VLSI devices.

Although this embodiment of the invention has been described for a circuit board including one power plane, it will be apparent to those skilled in the art that it is equally applicable to circuit boards having more than one main power plane.

I claim:

1. A circuit board having a prescribed surface comprising:
   a ground system;
   a main power distribution system being disposed in a prescribed planar relationship to the prescribed surface of the circuit board; and
   at least one sub-power plane disposed in prescribed spatial relationship with a physically separate from said main power distribution system, said subpower plane being in the same planar relationship as said main power distribution system to the prescribed surface of the circuit board and being adapted to be connected to at least one VLSI device having multiple power input leads.

2. A circuit board as defined in claim 1 wherein said at least one sub-power plane is adapted to be connected directly under at least one corresponding VLSI device.

3. A circuit board as defined in claim 2 further including a plurality of capacitors and wherein said at least one sub-power plane is adapted to connect a first capacitor to a first power input lead of said VLSI device and to connect at least a second capacitor to a second power input lead of said VLSI device.

4. A circuit as defined in claim 3 and wherein said sub-power plane is adapted to connect said plurality of capacitors to said multiple power input leads of said VLSI device on a one-to-one basis.

5. A circuit board as defined in claim 3 further including a filter connecting said sub-power plane to said main power distribution system for supplying power to said sub-power plane.

6. A circuit board as defined in claim 5 wherein said filter comprises a capacitor, a ferrite bead and one of said plurality capacitors and is arranged in a $\pi$ configuration.

7. A circuit board as defined in claim 6 wherein said ground system is a ground grid and wherein each of said capacitors has a terminal adapted to be connected to said ground grid.

8. A circuit board as define din claim 3 wherein said main power distribution system is a main power plane having said at least one sub-power plane disposed therein and physically separated therefrom, said sub-power plane being spatially disposed in the same plane as said main power plane relative to the prescribed surface of the circuit board.

9. A circuit board comprising:
   a ground system;
   a main power distribution system;
   at least one sub-power plane disposed in prescribed spatial relationship with and physically separate from said main power distribution system, said sub-power plane being adapted to be positioned directly under and connected to at least one VLSI device having multiple power input leads;
   a plurality of capacitors, said at least one sub-power plane being adapted to connect a first one of said plurality of capacitors to a first power input lead of said VLSI device and to connect at least a second one of said plurality of capacitors to a second power input lead of said VLSI device; and a filter connecting said sub-power plane to said main power distribution system for supplying power to said sub-power plane.

10. A circuit board as defined in claim 9, wherein said filter comprises a capacitor, a ferrite bead and one of said plurality capacitors and is arranged in a $\pi$ configuration.

11. A circuit board as defined in claim 10 wherein said ground system is a ground grid and wherein each of said capacitors has a terminal adapted to be connected to said ground grid.

* * * * *